United States Patent
Song et al.

(10) Patent No.: US 8,499,217 B2
(45) Date of Patent: Jul. 30, 2013

(54) MEMORY DEVICE AND ERROR CONTROL CODES DECODING METHOD

(75) Inventors: Seung-Hwan Song, Incheon (KR); Jun Jin Kong, Yongin-si (KR); Jae Hong Kim, Seoul (KR); Kyoung Lae Cho, Yongin-si (KR); Sung Chung Park, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1389 days.

(21) Appl. No.: 12/153,121

(22) Filed: May 14, 2008

(65) Prior Publication Data
US 2009/0177931 A1   Jul. 9, 2009

(30) Foreign Application Priority Data
Jan. 3, 2008 (KR) .................. 10-2008-0000872

(51) Int. Cl.
  *H03M 13/00* (2006.01)
  *G06F 11/00* (2006.01)
  *G11C 29/00* (2006.01)

(52) U.S. Cl.
  USPC ........... 714/758; 714/780; 714/704; 714/718; 714/722; 714/799; 714/2; 714/6.1; 714/42; 714/48; 365/185.09; 365/200; 365/201

(58) Field of Classification Search
  USPC ............... 714/758, 780, 2, 6.1, 42, 48, 704, 714/718, 722, 799; 365/185.09, 200, 201
  See application file for complete search history.

(56) References Cited

U.S. PATENT DOCUMENTS

| | | | |
|---|---|---|---|
| 6,700,938 B1 * | 3/2004 | Feeney et al. | 375/265 |
| 6,992,932 B2 | 1/2006 | Cohen | |
| 7,299,043 B2 * | 11/2007 | Mouna-Kingue et al. | 455/434 |
| 7,856,028 B2 * | 12/2010 | Yousefi et al. | 370/419 |
| 7,936,849 B2 * | 5/2011 | Cho et al. | 375/341 |
| 2004/0037262 A1 * | 2/2004 | Tanada | 370/342 |
| 2006/0045214 A1 * | 3/2006 | Shiina | 375/341 |
| 2007/0124625 A1 * | 5/2007 | Hassan et al. | 714/704 |
| 2011/0116357 A1 * | 5/2011 | Yousefi et al. | 370/201 |

FOREIGN PATENT DOCUMENTS

| | | |
|---|---|---|
| JP | 10-011982 | 1/1998 |
| JP | 2000-076876 | 3/2000 |
| JP | 2000-269825 | 9/2000 |
| JP | 2003-289292 | 10/2003 |

(Continued)

OTHER PUBLICATIONS

Lavoie et al., New VLSI Architectures for Fast Soft-Decision Threshold Decoders, Feb. 1991, IEEE, vol. 39, pp. 200-207.*

(Continued)

*Primary Examiner* — John J Tabone, Jr.
(74) *Attorney, Agent, or Firm* — Harness, Dickey & Pierce, P.L.C.

(57) ABSTRACT

Memory devices and/or error control codes (ECC) decoding methods may be provided. A memory device may include a memory cell array, and a decoder to perform hard decision decoding of first data read from the memory cell array by a first read scheme, and to generate output data and error information of the output data. The memory device may also include and a control unit to determine an error rate of the output data based on the error information, and to determine whether to transmit an additional read command for soft decision decoding to the memory cell array based on the error rate. An ECC decoding time may be reduced through such a memory device.

20 Claims, 6 Drawing Sheets

FOREIGN PATENT DOCUMENTS

| | | |
|---|---|---|
| JP | 2004-241833 | 8/2004 |
| KR | 1020010070086 | 7/2001 |
| KR | 1020030051043 | 6/2003 |
| KR | 1020030053028 | 6/2003 |
| KR | 1020050094569 | 9/2005 |
| KR | 100766042 | 10/2007 |

OTHER PUBLICATIONS

Gross et al., Simulation Results for Algebraic Soft-Decision Decoding of Reed-Solomon Codes, IEEE, 2002, pp. 1-5.*

Gross et al., Applications of Algebraic Soft-Decision Decoding of Reed-Solomon Codes, IEEE, 2003, pp. i, ii, 1-30.*

Gross et al., Applications of Algebraic Soft-Decision Decoding of Reed-Solomon Codes, Jul. 23, 2003, IEEE, pp. ii, 1-30.*

Fossorier et al., Soft-Decision Decoding of Linear Block Codes Based on Ordered Statistics, Sep. 1995, IEEE, vol. 41, No. 5, pp. 1379-1396.*

International Search Report dated Oct. 30, 2008.

Office Action for corresponding Japanese patent application No. 2011-519966 dated Nov. 13, 2012.

* cited by examiner

MEMORY DEVICE AND ERROR CONTROL CODES DECODING METHOD

PRIORITY STATEMENT

This application claims priority from Korean Patent Application No. 10-2008-0000872, filed on Jan. 3, 2008, in the Korean Intellectual Property Office (KIPO), the entire contents of which are incorporated herein by reference.

BACKGROUND

Generally, a path for transmitting information may refer to a channel. When information is transmitted using a wired communication, the channel may be a transmission line transmitting the information, and when information is transmitted using a wireless communication, the channel may be electromagnetic waves transmitting the information.

Also, a process of storing information in a semiconductor memory device and reading the stored information from the semiconductor memory device may be the channel. The channel may be a temporal lapse from storing of the information until reading of the information, and may also be a physical path of storing information in the semiconductor memory device and reading the stored information from the semiconductor memory device.

While information is being transmitted via the channel, the information may be corrupted. The corrupted information may include an error and thus apparatuses and methods of detecting the error from the corrupted information and eliminating the detected error to restore initial information may be needed.

A process of adding error control codes (ECC) to initial information prior to transmitting the information to thereby generate transmission information may be referred to as ECC encoding. A process of receiving the transmission information and separating the ECC from the received transmission information to thereby restore the initial information may be referred to as ECC decoding.

Depending on channel characteristics, an error rate in the channel may be high. Generally, as the error rate increases, hardware complexity for ECC encoding and ECC decoding may increase in order to overcome the errors and achieve the desired performance.

In the case of the channel having the high error rate, a concatenated encoder concatenating a plurality of ECC encoders may be used. A process of restoring the initial information from the information generated by the concatenated encoder may be generally embodied using a concatenated decoder.

The concatenated decoder may be generally composed in a reverse order of the concatenated encoder. For example, when the concatenated encoder includes encoder A followed by encoder B, the concatenated decoder may include decoder B followed by decoder A.

ECC decoders and ECC decoding methods may be applied to memory devices that reduce decoding times.

SUMMARY

Example embodiments may provide error control codes (ECC) decoders of memory devices and/or ECC decoding methods that may selectively apply hard decision decoding or soft decision decoding, reduce decoding times, and/or improve decoding performances.

Example embodiments also may provide ECC decoders of memory devices and/or ECC decoding methods that may selectively apply hard decision decoding or soft decision decoding based on error rates of read data.

Example embodiments also may provide ECC decoders of memory devices and/or ECC decoding methods that may control errors of data read from the memory devices by adjusting read voltages of the memory devices based on error rates of the read data.

According to example embodiments, a memory device may include a memory cell array, a decoder to perform hard decision decoding of first data read from the memory cell array by a first read scheme and to generate output data and error information of the output data, and/or a control unit to determine an error rate of the output data based on the error information and to determine whether to transmit an additional read command for soft decision decoding to the memory cell array based on the error rate.

Example embodiments may also include an internal decoder to iteratively perform internal decoding of data read from the memory cell array, and to generate internal output data and error information of the internal output data, a control unit to generate an internal decoding control signal and an external decoding control signal based on the error information and to transmit the internal decoding control signal to the internal decoder, and/or an external decoder to perform external decoding of the internal output data and to generate an output signal when the external decoding control signal is received. In this instance, the internal decoding control signal may be a signal of controlling whether to stop iteration of the internal decoding and whether the internal decoder may perform hard decision decoding or performs soft decision decoding, and the external decoding control signal may be a signal of controlling whether the external decoder starts the external decoding.

According to example embodiments, an error control codes decoding method may include performing hard decision decoding of input data and generating hard decision-decoded data, comparing an error rate of the hard decision-decoded data and a target error rate, and/or determining whether to additionally perform soft decision decoding of the input data based on a comparison result.

BRIEF DESCRIPTION

The above and/or other aspects, and advantages will become more apparent and more readily appreciated from the following detailed description of example embodiments, taken in conjunction with the accompanying drawings, in which.

DETAILED DESCRIPTION

Figure 1:
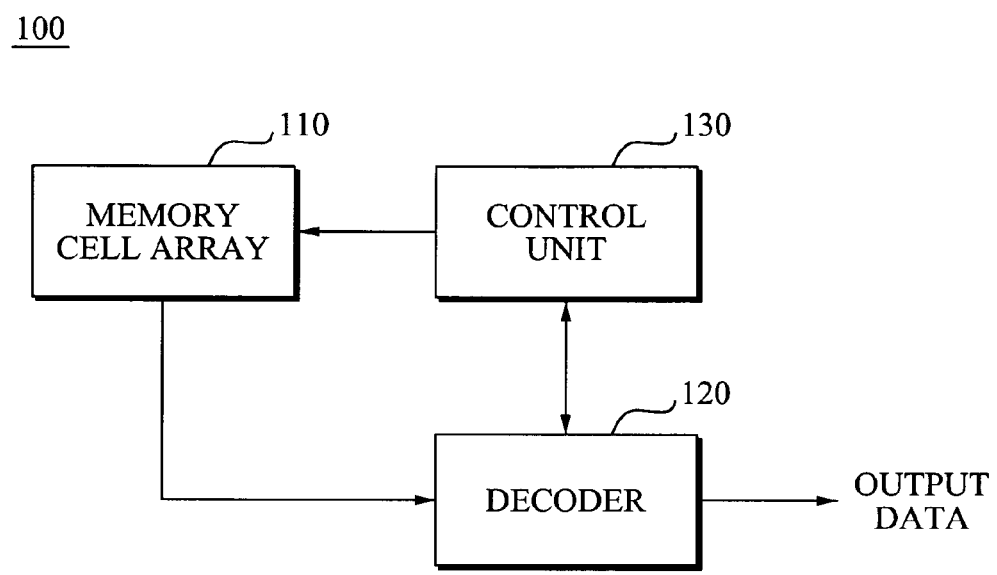
FIG. 1 is a diagram illustrating a memory device according to example embodiments.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

A single-level cell (SLC) memory device may store one bit of data in a single memory cell. The SLC memory may be referred to as a single-bit cell (SBC) memory. The SLC memory may store and read data of one bit at a voltage level included in two distributions that may be divided by a threshold voltage level programmed in a memory cell. The programmed threshold voltage may have a distribution within a certain range due to a fine electric characteristic difference between the SLC memories. For example, when a voltage level read from the memory cell is greater than 0.5V and less than 1.5V, it may be determined that the data stored in the memory cell has a logic value of "1." When the voltage level read from the memory cell is greater than 2.5V and less than 3.5V, it may be determined that the data stored in the memory cell has a logic value of "0." The data stored in the memory cell may be classified depending on the difference between cell currents and/or cell voltages during the reading operations.

Meanwhile, a multi-level cell (MLC) memory device may store two or more bits of data in a single memory cell. The MLC memory device has been proposed in response to a need for higher integration of memory. The MLC memory device may be referred to as a multi-bit cell (MBC) memory. However, as the number of bits stored in a single memory cell increases, reliability may deteriorate and read-failure rates may increase. To store 'm' bits in a single memory cell, $2^m$ voltage level distributions may be required. However, because the voltage window for a memory device may be limited, the difference in threshold voltage between adjacent bits may decrease as 'm' increases, causing the read-failure rate to increase.

In the MLC memory device, error control codes (ECC) may be added in order to prevent the read failure rate from increasing as 'm' increases. A process of adding the ECC to data may be referred to as ECC encoding, and a process of eliminating the ECC from the data read from a memory may be referred to as ECC decoding.

A memory device including an ECC decoder may be disclosed as described below.

FIG. 1 is a diagram illustrating a memory device 100 according to example embodiments.

Referring to FIG. 1, the memory device 100 may include a memory cell array 110, a decoder 120, and a control unit 130.

The decoder 120 may perform hard decision decoding of first data read by a first read scheme from the memory cell array 110, and generate output data and error information of the output data.

The control unit 130 may determine an error rate of the output data based on the error information received from the decoder 120, and determine whether to transmit an additional read command for soft decision decoding to the memory cell array 110 based on the error rate.

The control unit 130 may transmit the additional read command to the memory cell array 110 when the error rate is higher than a target error rate. Since the data read from the memory cell array 110 may not be accurately restored by only the hard decision decoding when the error rate is higher than the target error rate, the memory cell array 110 may additionally read the data corresponding to the additional read command.

The memory cell array 110 may additionally read data read by a second read scheme when the additional read command is received. The memory cell array 110 may transmit the additionally-read second data to the decoder 120.

The decoder 120 may perform the soft decision decoding of the second data and update the output data. Since the soft decision decoding may require more input data than the hard decision decoding, the second data may include more bits than the first data.

For example, the first data may be 4 bits and the second data may be 16 bits. The decoder 120 may perform the hard decision decoding of the first data and generate the output data of 4 bits. When the error rate of the generated output data is higher than the target error rate, the decoder 120 may perform the soft decision decoding of the second data and update the output data of 4 bits.

The control unit 130 may transmit, to the decoder 120, a control signal enabling the decoder 120 to perform any one of the hard decision decoding and the soft decision decoding. In this instance, the control unit 130 may store a decoding history of the decoder 120, and generate the control signal based on the stored history.

The memory device 100 may perform the hard decision decoding and generate the output data. When accurate output data may be acquired by only the hard decision decoding, the memory device 100 may perform the hard decision decoding with respect to a subsequent data bit stream.

The memory device 100 may perform the hard decision decoding and generate the output data. When accurate output data may not be acquired by only the hard decision decoding, the memory device 100 may additionally read the data from the memory cell array 110, perform the soft decision decoding of the additionally-read second data, and update the output data.

The decoder 120 may include a single decoding module, and the single decoding module may selectively perform any one of the hard decision decoding and the soft decision decoding. Alternatively, the decoder 120 may include a hard decision decoding module and a separate soft decision decoding module.

Also, the decoder 120 may include the hard decision decoding module, the soft decision decoding module, and a multiplexer. In this instance, two separate data paths for the hard decision decoding module and the soft decision decoding module may exist, and the multiplexer may select and output any one of the data transmitted to the two separate data paths.

The hard decision decoding module may perform the hard decision decoding of the first data and generate the hard decision-decoded data, and the soft decision decoding module may perform the soft decision decoding of the second data and generate the soft decision-decoded data. The multiplexer may output any one of the hard decision-decoded data and the soft decision-decoded data based on the control signal received from the control unit 130.

The error information may be at least one of parity check information and a bit error rate (BER). When the error information is the parity check information, the control unit 130 may check parity and generate the error rate. When the error information is the BER, the control unit 130 may compare the BER and a target BER.

The control unit 130 may transmit an output command of the output data to the decoder 120 when the error rate is lower than or equal to a target error rate. The decoder 120 may output the output data when the output command is received. Since the memory device 100 may acquire the reliable output data by only the hard decision decoding when the error rate is lower than or equal to the target error rate, the memory device 100 may not perform the soft decision decoding but instead perform only the hard decision decoding with respect to the subsequent data bit stream.

The decoder 120 may be a concatenated decoder including an internal decoder and an external decoder. In this instance, the decoder 120 may generate the error information using final output data of the external decoder.

The memory device 100 may reduce an ECC decoding time by selectively performing the hard decision decoding and the soft decision decoding. Generally, the hard decision decoding may be performed more quickly than the soft decision decoding. Since the hard decision decoding may perform decoding using 1 bit of data per 1 bit of output data, and the soft decision decoding may perform the decoding using multiple bits of data per 1 bit of output data, the soft decision decoding may perform the decoding more accurately than the hard decision decoding.

The memory device 100 may reduce the ECC decoding time and acquire a greater accuracy level of performing the soft decision decoding by selectively performing the hard decision decoding and the soft decision decoding.

The hard decision decoding and the soft decision decoding performed by the memory device 100 may be related to a read voltage level applied to the memory cell array 110. The soft decision decoding may be performed by adjusting the read voltage level related to the hard decision decoding.

The memory cell array 110 may adjust the read voltage level based on the error information when the additional read command is received.

The memory cell array 110 may read the second data by the second read scheme when the additional read command is received. In this instance, the second read scheme may be a scheme of setting a greater number of read voltage levels than the first read scheme. The second read scheme may also be a scheme of reading a greater number of set read voltage levels than the first read scheme.

Figure 2:
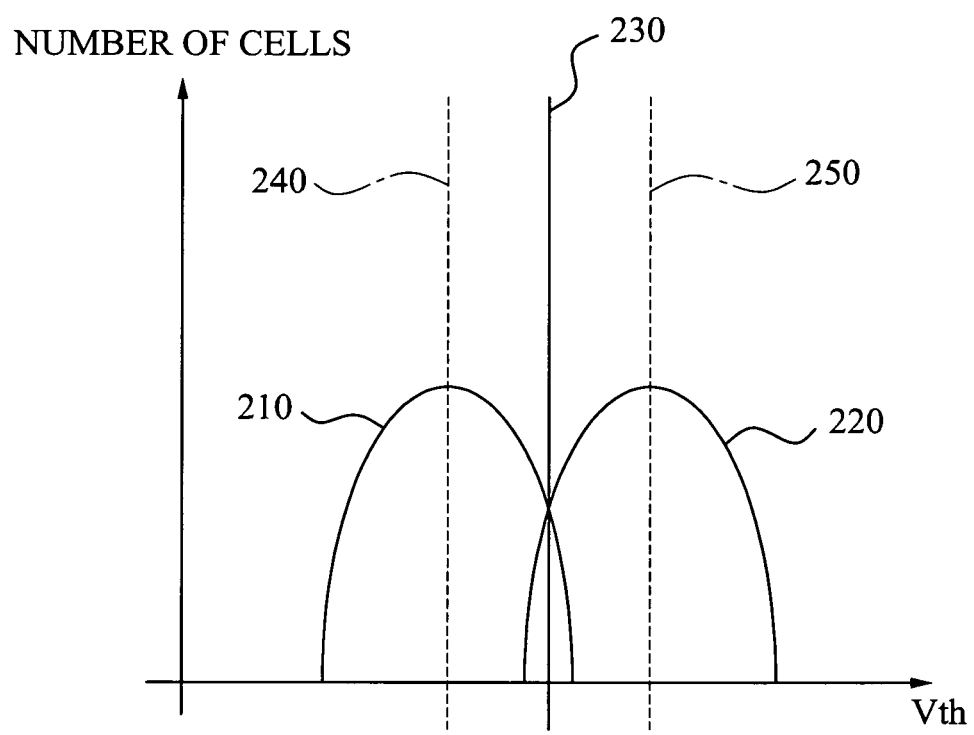
FIG. 2 is a graph illustrating an example of a first read scheme and second read scheme of a memory cell array of FIG. 1.

FIG. 2 is a graph illustrating an example of a first read scheme and a second read scheme of the memory cell array 10 of FIG. 1.

Referring to FIG. 2, a horizontal axis may denote threshold voltages of memory cells, and a vertical axis may denote a number of the memory cells having the threshold voltages.

The threshold voltages of the memory cells, not having uniform values due to a difference of an electric characteristic of each of the memory cells, may be distributed, and form distribution states.

A distribution state 210 may denote a distribution of the threshold voltages of the memory cells corresponding to data "1," and a distribution state 220 may denote a distribution of the threshold voltages of the memory cells corresponding to data "0."

The first read scheme may be a read scheme associated with hard decision decoding, and may select a voltage level 230 as a read voltage level.

The memory cell array 110 may read the first data by the first read scheme. The memory cell array 110 may recognize the memory cells having the threshold voltages higher than the voltage level 230 as the memory cells storing data "0," and may recognize the memory cells having the threshold voltages lower than the voltage level 230 as the memory cells storing data "1."

When the distribution state 210 and the distribution state 220 are overlapped, the memory cell array 110 may have errors proportional to the overlap according to the first read scheme. A portion of the memory cells corresponding to the distribution state 210 may be incorrectly recognized as data "0," and a portion of the memory cells corresponding to the distribution state 220 may be incorrectly recognized as data "1."

The second read scheme is a read scheme associated with soft decision decoding, and may select the voltage level 230, a voltage level 240, and a voltage level 250 as read voltage levels.

The memory cell array 110 may allocate "0" to the memory cells having the threshold voltages higher than the voltage level 240, and may allocate "1" to the memory cells having the threshold voltages lower than the voltage level 240. The memory cell array 110 may allocate "0" to the memory cells having the threshold voltages higher than the voltage level 250, and may allocate "1" to the memory cells having the threshold voltages lower than the voltage level 250.

The memory cell array 110 may sequentially arrange a bit allocated based on a comparison result of the threshold voltage of the memory cell and the voltage level 240, a bit allocated based on a comparison result of the threshold voltage of the memory cell and the voltage level 230, and a bit allocated based on a comparison result of the threshold voltage of the memory cell and the voltage level 250, and may generate second data.

In the case of FIG. 2, four combinations of the second data may be possible: "111," "011," "001," and "000."

The memory cells recognized as second data "111" may be recognized as data "1" when performing the hard decision decoding, and may be recognized as data "1" when performing the soft decision decoding.

The memory cells recognized as second data "000" may be recognized as data "0" when performing the hard decision decoding, and may be recognized as data "0" when performing the soft decision decoding.

The memory cells recognized as second data "011" may be recognized as data "1" when performing the hard decision decoding. However, the memory cells recognized as "011" may be recognized as data "1" or data "0" when performing the soft decision decoding. A soft decision decoding scheme may determine whether a data value of "1" or "0" is selected when performing the soft decision decoding.

The memory cells recognized as second data "001" may be recognized as data "0" when performing the hard decision decoding. However, the memory cells recognized as second data "001" may be recognized as data "1" or data "0" when performing the soft decision decoding. The soft decision decoding scheme may determine whether a data value of "1" or "0" is selected when performing the soft decision decoding.

The memory cell array 110 may detect the threshold voltages of the memory cells using the voltage level 230 in order to generate first data for the hard decision decoding.

When the additional read command is received from the control unit 130, the memory cell array 110 may perform an additional read operation using the voltage level 240 and the voltage level 250 in order to generate second data for the soft decision decoding. Since a read operation of the memory cell array 110 may be an operation requiring a relatively long time, the memory cell array 110 may not additionally perform the read operation by comparing the voltage level 230, common in the first read scheme and the second read scheme, to the threshold voltages of the memory cells.

Specifically, the memory cell array 110 may generate the first data using the voltage level 230 when performing the read operation by the first read scheme, and may generate the second data using the voltage level 240 and the voltage level 250 when performing the read operation by the second read scheme. In this instance, the memory cell array 110 may generate the second data using the first data.

Figure 3:
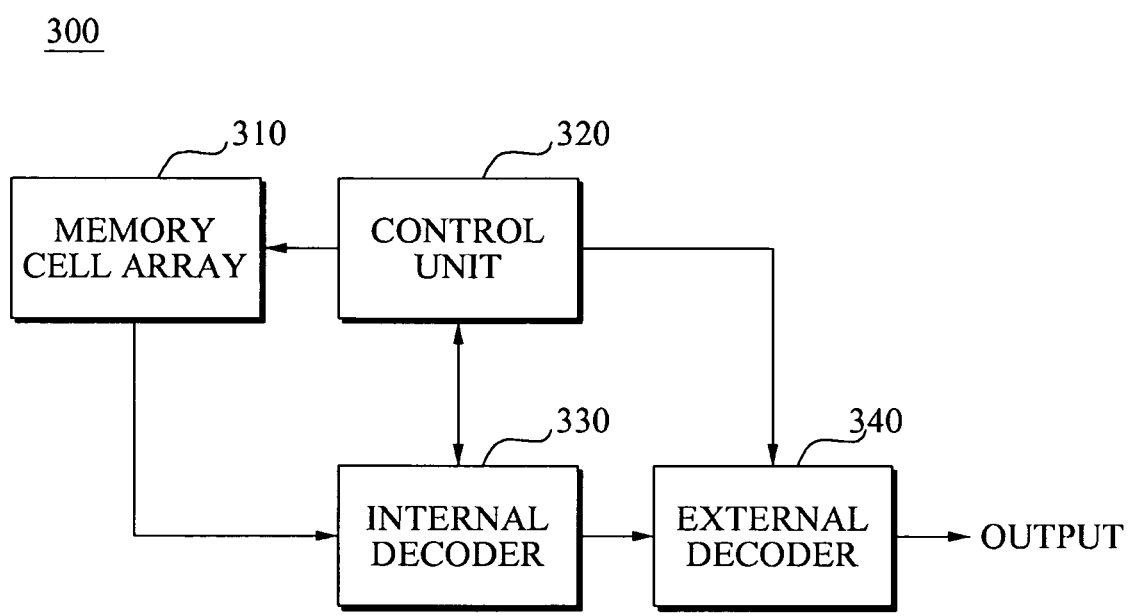
FIG. 3 is another diagram illustrating a memory device according to example embodiments.

FIG. 3 is another diagram illustrating a memory device 300 according to example embodiments.

Referring to FIG. 3, the memory device 300 may include a memory cell array 310, a control unit 320, an internal decoder 330, and an external decoder 340.

The internal decoder 330 may iteratively perform internal decoding of data read from the memory cell array 310, and generate internal output data. In this instance, the internal decoder 330 may also generate error information of the internal output data.

The control unit 320 may generate an internal decoding control signal and an external decoding control signal based on the error information from the internal decoder 330. The control unit 320 may transmit the internal decoding control signal to the internal decoder 330, and may transmit the external decoding control signal to the external decoder 340. The external decoding control signal may, for example, be transmitted either directly to the external decoder 340 or optionally, through the internal decoder 330.

The external decoder 340 may perform external decoding of the internal output data, and may generate an output signal when the external decoding control signal is received.

The internal decoding control signal may control whether to stop iteration of the internal decoding and whether the internal decoder performs hard decision decoding or performs soft decision decoding.

The external decoding control signal may control whether the external decoder starts the external decoding.

The internal decoder 330 may perform the hard decision decoding of the data read from the memory cell array 310, and generate the internal output data.

The control unit 320 may generate an error rate from the error information of the internal output data generated by performing the hard decision decoding. When the generated error rate is higher than a target error rate, the control unit 320 may generate and transmit the internal decoding control signal to iteratively perform the internal decoding. When the generated error rate is lower than or equal to the target error rate, the control unit 320 may generate and transmit the internal decoding control signal to stop the iteration of the internal decoding, and generate and transmit the external decoding control signal to start the external decoding.

When the internal decoding control signal to iteratively perform the internal decoding is received from the control unit 320, the internal decoder 330 may perform the soft decision decoding of the previous internal output data, and generate the new internal output data.

The control unit 320 may generate an error rate from the error information of the internal output data generated by performing the soft decision decoding, and generate and transmit the internal decoding control signal to iteratively perform the soft decision decoding when the generated error rate is higher than the target error rate.

The control unit 320 may generate a read control signal for controlling a read voltage level of the memory cell array 310 based on the error information, and transmit the read control signal to the memory cell array 310.

Another memory device according to example embodiments (not illustrated) may include an m-bit cell array to store m-bit data.

When reading m-bit information from an m-bit cell of the m-bit cell array, the memory device may perform m-number of read operations (or alternatively, $2^m-1$ number of read operations according to example embodiments) using read voltage levels for hard decisions. The memory device may perform the hard decision decoding of the read data and acquire first output data. When the error rate of the first output data is higher than the target error rate, the memory device may perform an additional read operation using read voltage levels for soft decisions.

When reading k-th bit information from among the m-bit cell of the m-bit cell array, the memory device may first perform the read operation once using the read voltage levels for hard decisions. Similarly, when the error rate of the first output data acquired by performing the hard decision decoding of the read data is higher than the target error rate, the memory device may perform the additional read operation using the read voltage levels for soft decisions.

Another memory device according to example embodiments (not illustrated) may include a multi-bit cell array and a decoder to perform soft decision decoding of data read from the multi-bit cell array. In this instance, the decoder may output each page of the read data based on a sequence of hard decision decoding.

Another memory device according to example embodiments (not illustrated) may include a memory cell array, a first decoder to perform hard decision decoding, a second decoder to perform soft decision decoding, and a control unit. The control unit may select an output of the first decoder and an output of the second decoder based on a result of a parity check or a monitoring result of a BER of the output of the first decoder and the output of the second decoder.

Figure 4:
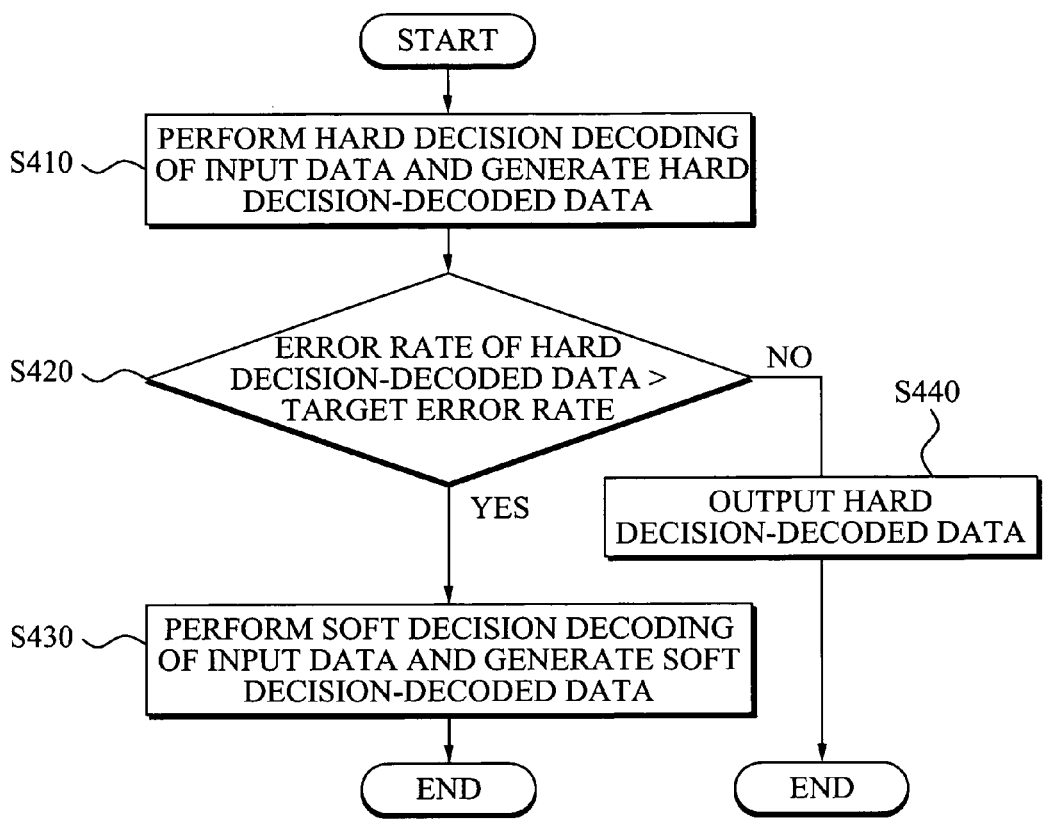
FIG. 4 is a flowchart illustrating an error control codes (ECC) decoding method according to example embodiments.

FIG. 4 is a flowchart illustrating an ECC decoding method according to example embodiments.

Referring to FIG. 4, in operation S410, the ECC decoding method may perform hard decision decoding of input data and generate hard decision-decoded data.

In operation S420, the ECC decoding method may compare an error rate of the hard decision-decoded data and a target error rate.

The ECC decoding method may determine whether to additionally perform soft decision decoding of the input data based on a comparison result.

In operation S430, when the error rate of the hard decision-decoded data is higher than the target error rate, the ECC decoding method may perform the soft decision decoding of the input data and output the soft decision-decoded data.

In operation S440, when the error rate of the hard decision-decoded data is lower than or equal to the target error rate, the ECC decoding method may output the hard decision-decoded data.

The ECC decoding method may generate the decoded data using the data read from the memory cell array as the input data.

When the error rate is higher than the target error rate, the ECC decoding method may adjust read voltage levels used for reading of the input data from the memory cell array. The ECC decoding method may perform the soft decision decoding of the data read from the memory cell array using the adjusted read voltage.

Figure 5:
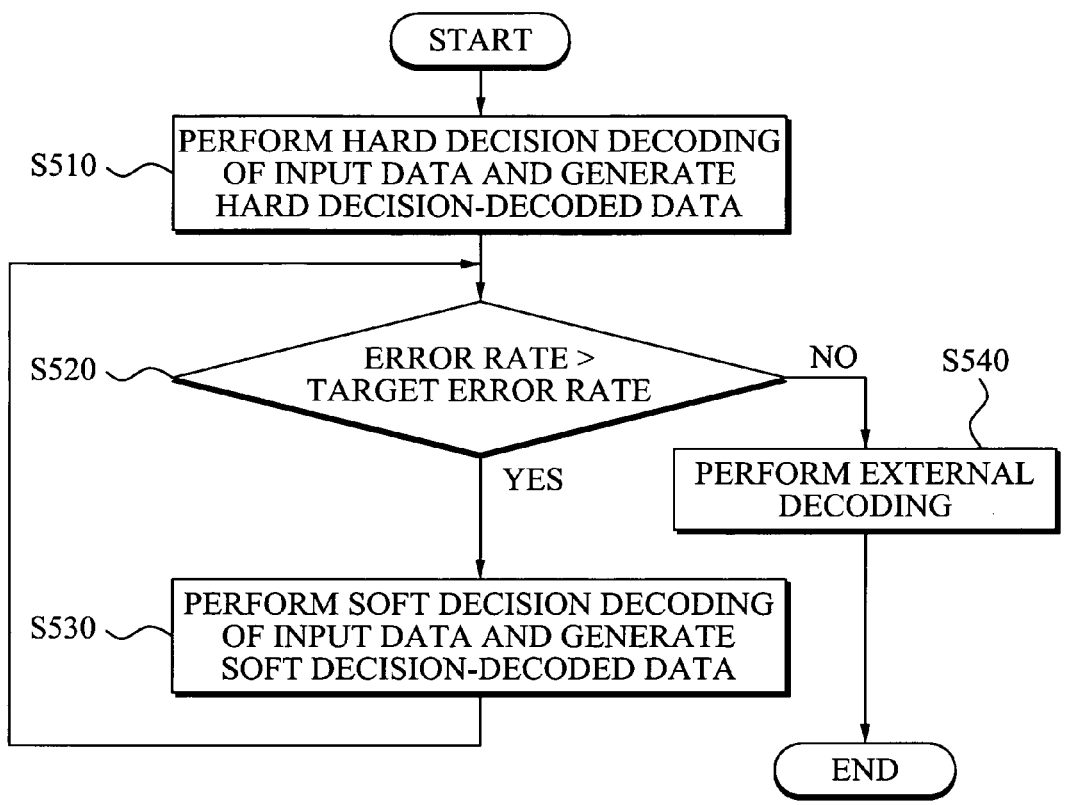
FIG. 5 is another flowchart illustrating an ECC decoding method according to example embodiments.

FIG. 5 is another flowchart illustrating an ECC decoding method according to example embodiments.

Referring to FIG. 5, in operation S510, the ECC decoding method may perform hard decision decoding of input data and generate hard decision-decoded data.

In operation S520, the ECC decoding method may determine whether an error rate of the hard decision-decoded data or soft decision-decoded data is higher than a target error rate.

In operation S530, when the error rate is higher than the target error rate, the ECC decoding method may perform the soft decision decoding of the input data and generate the soft decision-decoded data.

The ECC decoding method may perform operation S520 again after performing operation S530.

When the error rate is lower than or equal to the target error rate, the ECC decoding method may generate the hard decision-decoded data or the soft decision-decoded data as internal output data. In operation S540, the ECC decoding method may perform external decoding of the internal output data and generates final output data.

Figure 6:
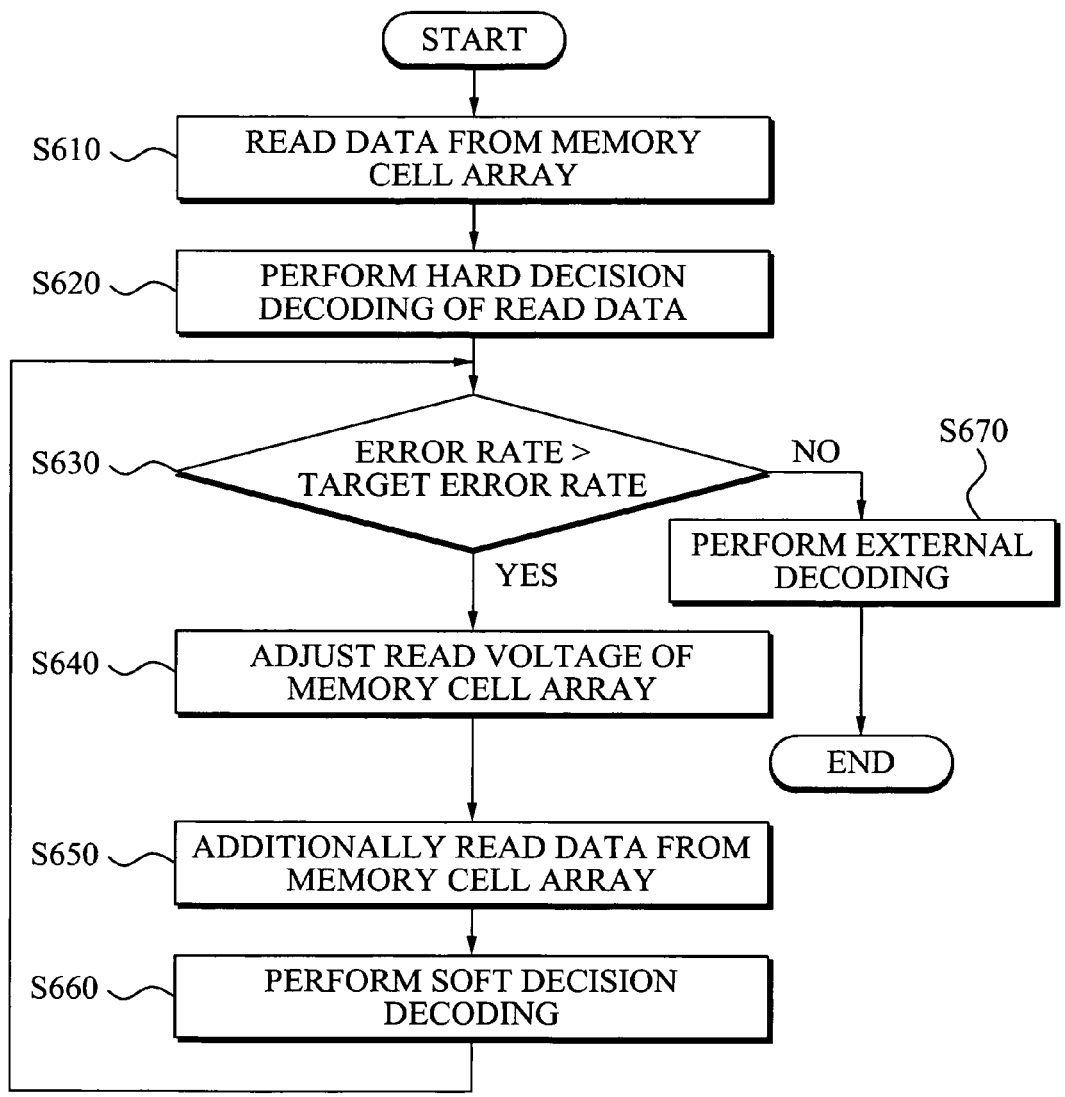
FIG. 6 is another flowchart illustrating an ECC decoding method according to example embodiments.

FIG. 6 is another flowchart illustrating an ECC decoding method according to example embodiments.

Referring to FIG. 6, in operation S610, the ECC decoding method may read data from a memory cell array.

In operation S620, the ECC decoding method may perform hard decision decoding of the read data and generate hard decision-decoded data.

In operation S630, the ECC decoding method may determine whether an error rate of the hard decision-decoded data or soft decision-decoded data is higher than a target error rate.

In operation S640, when the error rate is higher than the target error rate, the ECC decoding method may adjust a read voltage of the memory cell array.

In operation S650, the ECC decoding method may additionally read the data from the memory cell array using the adjusted read voltage.

In operation S660, the ECC decoding method may perform soft decision decoding of the additionally-read data and generate the soft decision-decoded data.

When the error rate is lower than or equal to the target error rate, the ECC decoding method may generate the hard decision-decoded data or the soft decision-decoded data as internal output data. In operation S670, the ECC decoding method may perform external decoding of the internal output data and generate final output data.

The ECC decoding methods according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that may be specially configured to store and perform program instructions, such as read-only memory (ROM), random access memory (RAM), flash memory, and the like. Examples of program instructions may include both machine code, such as produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages such as Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device for example, a host using any one of various types of interface protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that may maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system according to example embodiments may include a microprocessor that is electrically connected with a bus, a user interface, a modem such as a baseband chipset, a memory controller, and a flash memory device. The flash memory device may store N-bit data via the memory controller. The N-bit data may be processed by the microprocessor, and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

The foregoing descriptions of example embodiments have been presented for purposes of illustration and description. They are not intended to be exhaustive or to limit example embodiments to the precise forms disclosed, and obviously many modifications and variations are possible in light of the above teaching. Therefore, it is intended that the scope of example embodiments be defined by the claims appended thereto and their equivalents.

While example embodiments have been particularly shown and described, it will be understood by those of ordinary skill in the art that various changes in form and details may be made therein without departing from the spirit and scope of example embodiments as defined by the following claims.

What is claimed is:

1. A semiconductor memory device comprising:
a memory cell array;
a first decoder configured to perform hard decision decoding of first data read from the memory cell array by a first read scheme, and to generate output data and error information of the output data; and
a control unit configured to determine an error rate of the output data based on the error information, and to determine whether to transmit an additional read command for soft decision decoding to the memory cell array based on the error rate,
wherein the first decoder is configured to perform the soft decision decoding on second data read from the memory cell array if the additional read command is transmitted.

2. The semiconductor memory device of claim 1, wherein, the control unit is configured to transmit the additional read command to the memory cell array when the error rate is higher than a target error rate,
the memory cell array is configured to transmit, to the first decoder, the second data read from the memory cell array by a second read scheme when the additional read command is received, and
the first decoder is configured to updates the output data.

3. The semiconductor memory device of claim 2, wherein the control unit is configured to transmit a control signal to the first decoder, the memory device being configured such that the control signal enables the first decoder to perform at least one of the hard decision decoding and the soft decision decoding.

4. The semiconductor memory device of claim 2, wherein the memory cell array is configured to set a greater number of read voltage levels in the second read scheme than in the first read scheme, and the memory cell is configured to read the second data by the second read scheme using the set read voltage levels.

5. The semiconductor memory device of claim 1, wherein the control unit is configured to transmit an output command to the first decoder when the error rate is lower than or equal to a target error rate, and
the first decoder is configured to output the output data when the output command is received.

6. The semiconductor memory device of claim 1, wherein the additional read command is a command to adjust a read voltage level based on the error information.

7. The semiconductor memory device of claim 1, wherein the error information is at least one of parity check information and a bit error rate (BER).

8. The semiconductor memory device of claim 1, wherein,
the first decoder includes an internal decoder and an external decoder;
the internal decoder is configured to iteratively performs internal decoding of data read from the memory cell array and to generate internal output data and error information of the internal output data;
the external decoder is configured to perform external decoding of the internal output data and to generate an output signal when an external decoding control signal is received;
the control unit is configured to generate an internal decoding control signal and the external decoding control signal based on the error information, and to transmit the internal decoding control signal to the internal decoder;
the memory device is configured such that the internal decoding control signal controls whether to stop iteration of the internal decoding and whether the internal decoder performs hard decision decoding or performs soft decision decoding; and
the memory device is configured such that the external decoding control signal controls whether the external decoder starts the external decoding.

9. The semiconductor memory device of claim 8, wherein the control unit is configured to transmit, to the memory cell array, a read control signal to control a read voltage level of the memory cell array based on the error information.

10. The semiconductor memory device of claim 8, wherein the internal decoder is configured to perform the hard decision decoding once, and to perform the soft decision decoding during the iterative internal decoding.

11. The semiconductor memory device of claim 8, wherein the control unit is configured to generate an error rate from the error information, and to generate the internal decoding control signal to iteratively perform the internal decoding when the error rate is higher than a target error rate.

12. The semiconductor memory device of claim 8, wherein the control unit is configured to generate an error rate from the error information, to generate the internal decoding control signal to stop the iteration of the internal decoding when the error rate is lower than or equal to a target error rate, and to generate the external decoding control signal to start the external decoding.

13. The semiconductor memory device of claim 1, wherein,
the memory cell array includes a multi-bit cell array;
the first decoder is configured to perform soft decision decoding of data read from the multi-bit cell array; and
the first decoder is configured to output each page of the read data based on a sequence of the hard decision decoding.

14. The semiconductor memory device of claim 1, further comprising:
a second decoder configured to perform soft decision decoding, wherein
the control unit is configured to selects an output of one of the first decoder and the second decoder based on a result of at least of one a parity check and a monitoring result of a bit error rate (BER) of the output of the first decoder and the output of the second decoder.

15. The memory device of claim 1, wherein the control unit is configured to determine whether to transmit the additional read command for soft decision decoding based on the determined error rate of the output data after the first decoder performs the hard decision decoding of the first data and generates the output data.

16. An error control codes decoding method, the method comprising:
reading first input data from a memory array of a semiconductor memory device;
performing hard decision decoding of the first input data and generating hard decision-decoded data;
comparing an error rate of the hard decision-decoded data and a target error rate; and
determining whether to additionally perform soft decision decoding of the first input data based on the comparing.

17. The method of claim 16, further comprising:
adjusting a read voltage of the memory cell array when it is determined to additionally perform the soft decision decoding of the first input data based on the comparing; and
performing the soft decision decoding of the data read from the memory cell array using the adjusted read voltage.

18. The method of claim 16, further comprising:
additionally receiving second input data when it is determined to additionally perform the soft decision decoding of the first input data based on the comparing;
updating the first input data using the received second input data;
performing the soft decision decoding of the updated input data and generating soft decision-decoded data;
comparing an error rate of the soft decision-decoded data and the target error rate, and generating a soft decision comparison result; and
determining whether to continuously perform the soft decision decoding of the updated input data based on the soft decision comparison result.

19. The method of claim 16, further comprising:
performing external decoding of the hard decision-decoded data and generating output data when it is determined not to additionally perform the soft decision decoding of the first input data based on the comparing.

20. The error control codes decoding method of 16, wherein the determining includes determining whether to perform the soft decision decoding based on the error rate of the hard decision-decoded data after the performance of the hard decision decoding of the first input data.

* * * * *